United States Patent [19]

Green et al.

[11] Patent Number: 4,704,339

[45] Date of Patent: Nov. 3, 1987

[54] INFRA-RED TRANSPARENT OPTICAL COMPONENTS

[75] Inventors: Geoffrey W. Green, Malvern; Alan H. Lettington, Worcester, both of England

[73] Assignee: The Secretary of State for Defence in Her Britannic Majesty's Government of the United Kingdom of Great Britain and Northern Ireland, London, England

[21] Appl. No.: 818,496

[22] Filed: Jan. 13, 1986

Related U.S. Application Data

[63] Continuation-in-part of Ser. No. 541,312, Oct. 12, 1983, abandoned, and a continuation-in-part of Ser. No. 541,311, Oct. 12, 1983, abandoned.

[30] Foreign Application Priority Data

Oct. 12, 1982 [GB] United Kingdom ................ 8229125
Oct. 12, 1982 [GB] United Kingdom ................ 8229124

[51] Int. Cl.$^4$ .......................... B32B 15/04; B32B 9/00
[52] U.S. Cl. .................................... 428/689; 428/688; 428/409; 350/1.7; 350/1.4
[58] Field of Search ............... 428/688, 689, 408, 409; 350/1.1, 1.4, 1.7, 1.3; 204/192 R, 192 P

[56] References Cited

U.S. PATENT DOCUMENTS

| 3,424,661 | 1/1969 | Androshuk . | |
|---|---|---|---|
| 4,006,070 | 1/1972 | King et al. . | |
| 4,072,782 | 2/1978 | Kramer et al. | 428/409 |
| 4,289,822 | 9/1981 | Shimada et al. | 428/688 |
| 4,329,699 | 3/1980 | Ishihara et al. . | |
| 4,383,728 | 5/1983 | Litington | 350/1.7 |
| 4,394,400 | 1/1981 | Green et al. . | |
| 4,400,410 | 8/1983 | Green et al. | 427/38 |
| 4,412,903 | 11/1983 | Green et al. | 428/408 |
| 4,565,731 | 1/1986 | Komatsu et al. | 428/688 |

FOREIGN PATENT DOCUMENTS

| 0030638 | 6/1981 | European Pat. Off. . |
|---|---|---|
| 53-144891 | 12/1978 | Japan . |
| 57-155365 | 9/1982 | Japan . |
| 1495480 | 12/1977 | United Kingdom . |
| 1570044 | 6/1980 | United Kingdom . |
| 1574677 | 9/1980 | United Kingdom . |
| 2047877 | 12/1980 | United Kingdom . |
| 2050433 | 1/1981 | United Kingdom . |
| 2069008 | 8/1981 | United Kingdom . |
| 2081695 | 2/1982 | United Kingdom . |
| 2083841 | 3/1982 | United Kingdom . |
| 2082562 | 12/1983 | United Kingdom . |

OTHER PUBLICATIONS

Patent Abstracts of Japan, C. Field, vol. 6, No. 261, p. 150c, 141, (Dec. 21, 1982).

(List continued on next page.)

Primary Examiner—Roland E. Martin
Assistant Examiner—Beth A. Bozzelli
Attorney, Agent, or Firm—Cushman, Darby & Cushman

[57] ABSTRACT

A method of coating a substrate in a glow discharge chamber uses a source of hydrocarbon and another element. Butane and germane are used to deposit a coating of $Ge_xC_{1-x}$ where $0<x<1$ onto a germanium substrate. The substrate temperature is maintained above 400° C., typically 530° C., during growth to prevent inclusion of $H_2$ in the coating. The presence of Ge in the coating allows thick, stain-free, layers to be grown. Alternatively, butane and silane may be used to deposit $Si_xC_{1-x}$. Varying the proportions of the hydrocarbon and germane or silane allows a variation in the value of x.

A method of growing a combined layer of at least a first and a second material in glow discharge chamber. A target cathode formed on the first material, e.g., Si, Ge, W is arranged in the chamber and spaced from a substrate to be coated. Argon gas and a gas of the second material, e.g., a hydrocarbon, are admitted into the chamber and a glow discharge established. Hydrocarbon ions from the glow discharge plasma strike and deposit on the cathode target. Argon ions sputter off atoms of both C and bulk target material, e.g., Si, Ge, or W, which deposit onto the substrate and gradually build up a combined layer of, e.g., $Si_xC_{1-x}$, $Ge_xC_{1-x}$, $W_xC_{1-x}$ wherein $0<x<1$.

Optical lens components, infra-red transparent, made from these processes are also disclosed.

17 Claims, 4 Drawing Figures

OTHER PUBLICATIONS

D. A. Anderson, "The Electrical and Optical Properties of Amorphous Carbon Prepared by the Glow Discharge Technique", May 1976, pp. 17-26, *Philosophical Magazine,* vol. 35, No. 1.

D. A. Anderson and W. E. Spear, "Electrical and Optical Properties of Amorphous Silicon and Carbide, Silicon Nitride and Germanium Carbide Prepared by the Glow Discharge Technique", May 1976, pp. 1-16, *Philosophical Magazine,* vol. 35.

Y. Catherine and G. Turban, "Infrared Absorption of Hydrogenated Amorphous Si-C and Ge-C Films", 1979, 101-104, *Thin Solid Films,* 70.

D. C. Booth and K. J. Voss, "The Optical and Structural Properties of CVD Germanium Carbide", 1981, 1033-1036, *Journal De Physique,* Colloque C4, Supplement No. 10, Tome 42.

Maissel, Handbook of Thin Film Tech., pp. 4-26 to 4-31, (1970).

Vossen, Thin Film Processes, Acad. Press, pp. 48-53, (1978).

INFRA-RED TRANSPARENT OPTICAL COMPONENTS

RELATED APPLICATIONS

This application is a consolidation and continuation-in-part of U.S. application Ser. No. 541,311 and of U.S. application Ser. No. 541,312, both applications filed on Oct. 12, 1983, now abandoned the disclosures of which are hereby incorporated by reference.

FIELD OF THE INVENTION

The invention provides an infra-red transparent optical component with a hard abrasion resistant coating.

Such coatings are useful on, for example, germanium lenses used in infra-red imagers. The hard coating prevents damage to the surface of the relatively soft germanium.

One useful coating is a hard infra-red transparent carbon layer prepared by glow discharge deposition techniques. A disadvantage with such coatings is the high internal strains produced by the glow discharge deposition and the presence of interstitial carbon. The high strain prevents growth of thick layers and the interstitial carbon reduces the infra-red transparency.

An object of the present invention is to overcome these disadvantages and provide a relatively strain free coating having good infra-red transparency.

BACKGROUND OF THE INVENTION

There are a number of techniques for coating substrates. For example, a substrate may be suspended above a cathode target of the coating material in a vacuum. Argon ions are caused to strike the target thereby knocking off small particles of the target material which adhere to the substrate. Such a technique is known as sputtering. Carbon can be sputtered but the deposition rate is low and the coating may be graphitic.

Coatings may be grown in a plasma. For example, a substrate may be used as a cathode in a D.C. or A.C. excited hydrocarbon plasma. Carbon ions are attracted to strike the substrate and form a carbon layer which, for appropriate temperature and pressure conditions, is diamond-like.

Techniques for growing carbon films are described in the following: Thin Film Solids 58 (1979) 101-105, 106, 107-116, 117-120, and in various British patents such as, British Patent Specification Nos. 2,047,877, 2,067,304, 2,069,008, 2,082,562 and 2,083,841.

Techniques for growing amorphous layers of silicon and germanium by glow discharge are described in the following article and its associated references Spear, W. E., Doped Amorphous Semiconductor, Advances in Physics, 1977, Vol. 26, No. 6, 811-845.

A disadvantage with the prior art glow discharge deposition technique is that in order to achieve reasonable deposition rates high potentials have to be applied to or developed at the cathode, so that the substrate is subjected to high energy incident particles. This tends to affect adversely the stress in the coating and increases the back sputtering rate. In some cases this prevents deposition of a layer at all.

British Patent Specification No. 2,069,009 describes a growth technique in which a substrate is arranged above an aluminum cathode. Carbon ions strike the cathode, some adhere to the cathode and some bounce off and stick onto the substrate. A bias voltage may be applied to the substrate. This layer has a lower strain than similar layers deposited on cathodes but it still contains undesired interstitial carbon.

Additional efforts to provide coatings on substrates are known from U.S. Pat. No. 4,400,410. U.S. Pat. No. 4,400,410 describes a system for depositing discrete layers of carbon, silicon, and germanium onto electrically insulating substrates in a D.C. glow discharge chamber. This uses separate supplies of a hydrocarbon, silane, and germane respectively. The disclosed process must operate at a temperature below 300° C. to avoid forming an infra-red absorbing coating. The description makes no reference to strain-free coatings, or the hydrogen content of any coating.

SUMMARY OF THE INVENTION

This invention provides an infra-red transparent optical component comprising an infra-red transparent substrate coated on at least one surface with a layer, less than 10 um thick of $Ge_xC_{1-x}$, or $Si_xC_{1-x}$, where $0<x<1$, said layer being substantially infra-red transparent, hydrogen free, and strain free.

The substrate may be formed into a window or lens and may be of germanium, ZnS, or ZnSe.

Small amounts of Ge and/or Si give a hard carbon coating that is relatively strain free with little if any interstitial carbon. Exemplary suitable amounts of Ge and/or Si are less than about 10% by weight of Ge or Si in $Ge_xC_{1-x}$ or $Si_xC_{1-x}$. The value of x may vary across the thickness of the layer. The substrate may be coated with a plurality of layers, each having a different value of x with the last layer having the lowest value of x, i.e., the hardest layer. A bonding layer may be used directly on the substrate. For example a very thin layer of Ge may be deposited.

A hydrogen-free and halogen-free method of providing coatings of the present invention comprises the steps of providing a plasma containing the materials to be deposited as the coating in a chamber having a cathode structure, arranging a substrate to be coated on the cathode, and maintaining the substrate at an elevated temperature during growth of the coating(s) and the infra-red transparent substrate. The elevated temperature is above 400° C. which drives out any hydrogen.

Another method of growing a combined layer of at least a first and second material comprises the steps of arranging a first material forming a target material on a cathode in a glow discharge chamber, arranging a substrate to be coated on a holder at a spaced distance from the target, maintaining the substrate temperature at a required level above 400° C., admitting elements of the second material and a sputtering material into the chamber, and establishing a glow discharge within the chamber, the glow discharge plasma containing ions of the second material for adhering to the target material and ions of the sputtering material that sputter off both the first material and second material onto the substrate, the arrangement being such that ad molecules of the second material are deposited on the target molecules of both the first and second material are sputtered off to deposit on the substrate where a layer of the first and second material gradually builds up in thickness to the required value.

Lens coatings made by the above processes are essentially strain-free, hydrogen-free, halogen-free and infra-red transparent.

BRIEF DESCRIPTION OF FIGS. 1-4

DETAILED DESCRIPTION OF THE INVENTION

The invention will now be described in greater detail.

A method of depositing coatings containing carbon and another element comprises the steps of providing a plasma containing the materials to be deposited as a coating in a chamber having a cathode structure, arranging a substrate to be coated on the cathode, and maintaining the substrate at an elevated temperature during growth.

The elevated temperature is high enough, e.g., above about 400° C., to drive out the required amount of hydrogen. A typical temperature is about 530° C. although most hydrogen is driven out below this, e.g., at about 500° C.

According to another aspect of this embodiment of the invention, an apparatus for depositing a coating on a substrate comprises a vacuum tight chamber, a pump for maintaining a vacuum within the chamber, means for supplying a mixture of at least two gases (other than hydrogen) into the chamber, an anode and a cathode structure within the chamber, a cathode heater, a power supply or providing a glow discharge in the chamber adjacent the cathode, the arrangement being such that a plasma of at least two gaseous materials is established in the chamber so that ions of the material deposit on the substrate arranged on the cathode to form a coating.

Alternatively, one of the gas supplies may be replaced by a molecular beam oven or an ion beam source, etc., to provide one of the materials in the plasma. This oven or source may be mounted in the chamber and its contents directed into the region around the cathode.

The glow discharge may provide by D.C. or A.C. at any suitable frequency.

Figure 1:
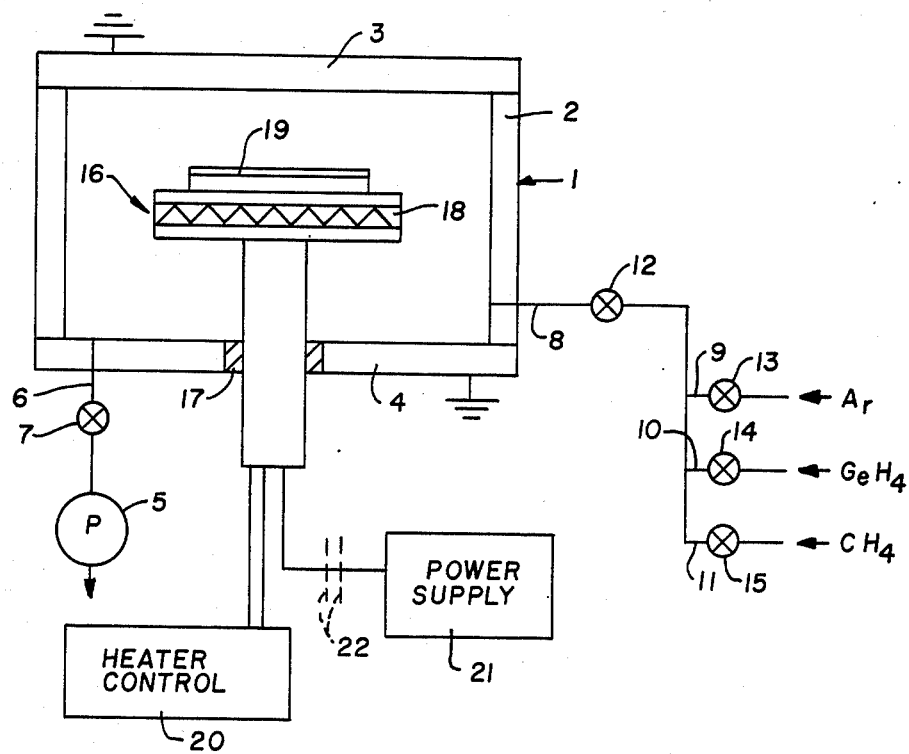
FIG. 1 is a sectional view of an apparatus for growing a coating.
Figure 2:
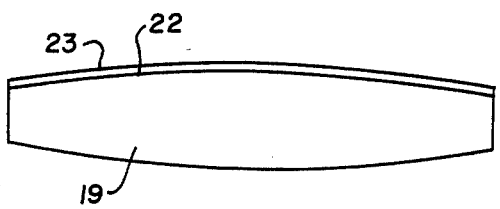
FIG. 2 is a sectional view of a lens coated in accordance with the process practiced by the apparatus illustrated in FIG. 1.

The invention will be now described by way of example with reference to FIG. 1 and FIG. 2.

The apparatus of FIG. 1 comprises a vacuum tight container 1 formed by an annular wall 2 and earthed top and bottom plates 3, 4, respectively. A pump 5 is connected through an exhaust pipe 6 and valve 7 to the chamber 1. Gas supplies of argon, germane and a hydrocarbon gas such as butane are fed into the chamber via inlet pipes 8, 9, 10, 11 and valves 12, 13, 14, 15. A cathode structure 16 is supported inside the chamber 1 and electrically insulated from the bottom plate 4 by a sleeve 17. Inside the cathode structure is a heater 18 for heating a substrate 19 arranged on the cathode 16. The cathode temperature is controlled by a heater control 20 which also supplies power to the heater 18. A power supply 21 feeds electrical power to the cathode 16. This power may be D.C., or A.C. via a blocking capacitor 22. Alternatively, an A.C. coil may surround the chamber 1 and induce a plasma within the chamber.

A germanium lens is illustrated in FIG. 2. The germanium lens may be coated with a layer of hard carbon as follows. The lens 19 is mounted on the cathode 16 with the surface 22 to be coated uppermost. The chamber 1 is evacuated by the pump 5 to less than $10^{-5}$ Torr. to remove contaminants. Argon gas is admitted through the valve 13 and the chamber pressure kept at about $10^{-2}$ Torr. on an air calibrated gauge.

A plasma is generated in argon by energizing the cathode 16 from the power supply 21. This provides an argon ion bombardment of the surface 22 to clean it prior to coating. About 2 minutes cleaning is usually adequate.

The cathode heater 18 is operated to raise the temperature of the lens 19 to above about 500° C., typically 530° C., and to maintain it at this value during growth of the coating.

The argon is removed by the pump 5 and a mixture of germane ($GeH_4$) and butane ($CH_4$) admitted via the inlet pipes 8, 10, 11 and valves 12, 14, 15. Pressure is maintained at around 0.7 to $1.10^{-2}$ Torr. A.C. power is typically 1 kvolt at 13 MHz and 200 watts power level is applied to create a plasma. Positively charged ions of C, and of Ge strike and remain on the lens surface gradually building up a layer 23 of hard carbon with small amounts of Ge included.

The layer thickness is time and composition dependent and is selected for optical properties (anti-reflection) and required durability. A typical layer thickness is about 1 to about 10 $\mu$m. The discharge is stopped when the layer has grown to the required thickness and the substrate is than allowed to cool.

To assist in growing a uniform layer, the substrate 19 may be rotated during growth.

The proportion of Ge in the C varies with the proportions of germane and butane gas admitted. For a hard carbon layer only small amounts of Ge are needed to provide a transparent carbon layer of extreme durability and hardness approaching that of diamond. The high substrate temperature prevents the inclusion of $H_2$ within the coating. Advantageously, including Ge within the coating results in a good bond being achieved by the coating directly with the bulk Ge lens. Thus for some applications no bonding layers are needed.

Should a bonding layer be required it may be obtained by the above process but without the hydrocarbon gas, i.e. x=1. This gives a germanium bonding layer from the gas germane. Similarly, a silicon bonding layer is obtainable from silane without a hydrocarbon gas.

The coating composition may vary within the thickness of the coating by adjusting the german:butane ratio. The value of x in the coating composition $Ge_xC_{1-x}$ is variable between 0 and 1, although the coating may not be homogeneous on a microscopic scale. For example, the initial deposits may have an x value around 1 to give good bonding; subsequent depositions may have an x value approaching zero to give a very hard surface.

The coating may be composed of multilayers wherein each layer has a different "x" value. A single layer may, of course, have an "x" value varying across the layer. The refractive index of the coating varies with x. Accordingly, coatings having varying refractice indices (grades) can be obtained; indeed, a coating having a graded, stepwise or continuously varying refractive index is obtainable. Thus, the values of x as well as the thickness of the coating or layer thickness can be tailored to give anti-reflective properties over an enhanced spectrum of wavelengths. These advantages are also obtainable in accordance with the second embodiment of the present invention.

The presence of small amounts of Ge in C helps prevent an absorbing coating from being grown. As previously noted, small amounts of Ge (and Si) in hard C coatings reduces the presence of interstitial carbon to give a very hard infra-red transparent layer. In addition, the $Ge_xC_{1-x}$ coatings have superior infra-red transparency at higher temperatures than coatings composed of Ge or Si alone. Ge and Si becomes, gradually, opaque to infra-red with increasing temperatures where the contrary characteristics are observed with the coatings of the present invention. The high temperature infra-red transparency feature is particularly advantageous in combination with a lens composed of ZnS and ZnSn. These advantages are also obtained in accordance with the second embodiment.

Substrates other than germanium may be coated. For example, ZnS, ZnSe may be used to give an infra-red transparent lens or window with a hard wear-resistant outer surface.

Coatings of silicon carbide $Si_xC_{1-x}$ ($0<x<1$) having the above-described advantageous properties, may also be grown as above but using silane instead of germane. Regular and irregular objects may be coated. For example, cutting tool tips may be given a hard wear-resistant coating. Also circular cross-section articles such as glass fibers may be coated using a shaped cathode as described in British Patent Application No. 2,099,212, the disclosure of which is hereby incorporated by reference. This cathode may take the form of a flat strip wound into an oven spiral surrounding the fiber which is slowly drawn through. Alternatively, the cathode may be segments arranged along a helix, or a perforated tube.

The plasma may be generated by D.C. power typically at $-2$ kvolt. Both conducting and insulating substrates may be coated. Insulating substrates may need a cathode structure of large area compared to substrate area.

A second embodiment for providing the infra-red transparent optical components of the present invention is now described. The second embodiment provides a method and a related apparatus for growing a combined layer of at least a first and a second material. The method comprises the steps of arranging a first material forming a target material on a cathode in a glow discharge chamber, arranging a substrate to be coated on a holder a spaced distance from the target, maintaining the substrate temperature at a required level, admitting elements of the second material and a sputtering material into the chamber, and establishing a glow discharge within the chamber, the glow discharge plasma containing ions of the second material for adhering to the target material and ions of the sputtering material that sputter off both the first material and second material onto the substrate, the arrangement being such that as molecules of the second material are deposited on the target, molecules of both the first and second material are sputtered off to deposit on the substrate where a layer of the first and second material gradually builds up in thickness to the required value.

The sputtering ions may be argon ions.

The target material may be a single material or a mixture of materials such as silicon, germanium, tungsten or any other material capable of being sputtered and forming a compound or mixture with the second material.

The second material may be carbon introduced as a hydrocarbon gas such as butane, methane, propane, etc.

The substrate temperature may be at an elevated temperature, e.g., above 300° C., typically 530° C., when using a hydrocarbon gas to prevent deposition of hydrogen on the substrate.

Additionally, a third or further materials may be introduced into the chamber as a gas to grow a layer of at least three elements. In some cases, an additional source of the first material may be introduced as a gas. For example, when using a Ge target, the gas germane may be bled into the chamber. This assists deposition of $Ge_xC_{1-x}$ onto the substrate. For a Si target, silane is introduced.

After growth of the required layer, the substrate may be removed or the layer left as a coating on the substrate.

The material grown may be $Si_xC_{1-x}$, $Ge_xC_{1-x}$, $W_xC_{1-x}$ ($0<x<1$) or any other suitable carbide of mixtures of carbides. The value of x may be changed, i.e., varied, across the thickness to the layer to provide a graded layer.

The second embodiment for providing the optical components of the present invention also includes an apparatus for growing a layer of at least a first and a second material on a substrate. The apparatus comprises a vacuum tight chamber, means for establishing a glow discharge in the chamber, a vacuum pump for evacuating the chamber, means for supplying gases into the chamber, and a substrate holder for supporting the substrate a spaced distance from the cathode, the arrangement being such that ions of one of the gases deposits on the cathode and both these and the target material are sputtered off to land on the substrate and build up as layer of the required material.

When growing layers containing carbon using a hydrocarbon gas, the substrate holder includes means for heating the substrate. This heating may be an electrical resistive heater or a susceptor and external R.F. coils. Typical substrate temperature is above 500° C., e.g., 530° C. The glow discharge may be energized by D.C. or A.C. (or any suitable frequency) power to the cathode, or by externally mounted R.F. coils.

The invention will now be described by way of example with reference to FIG. 3 and FIG. 4.

Figure 3:
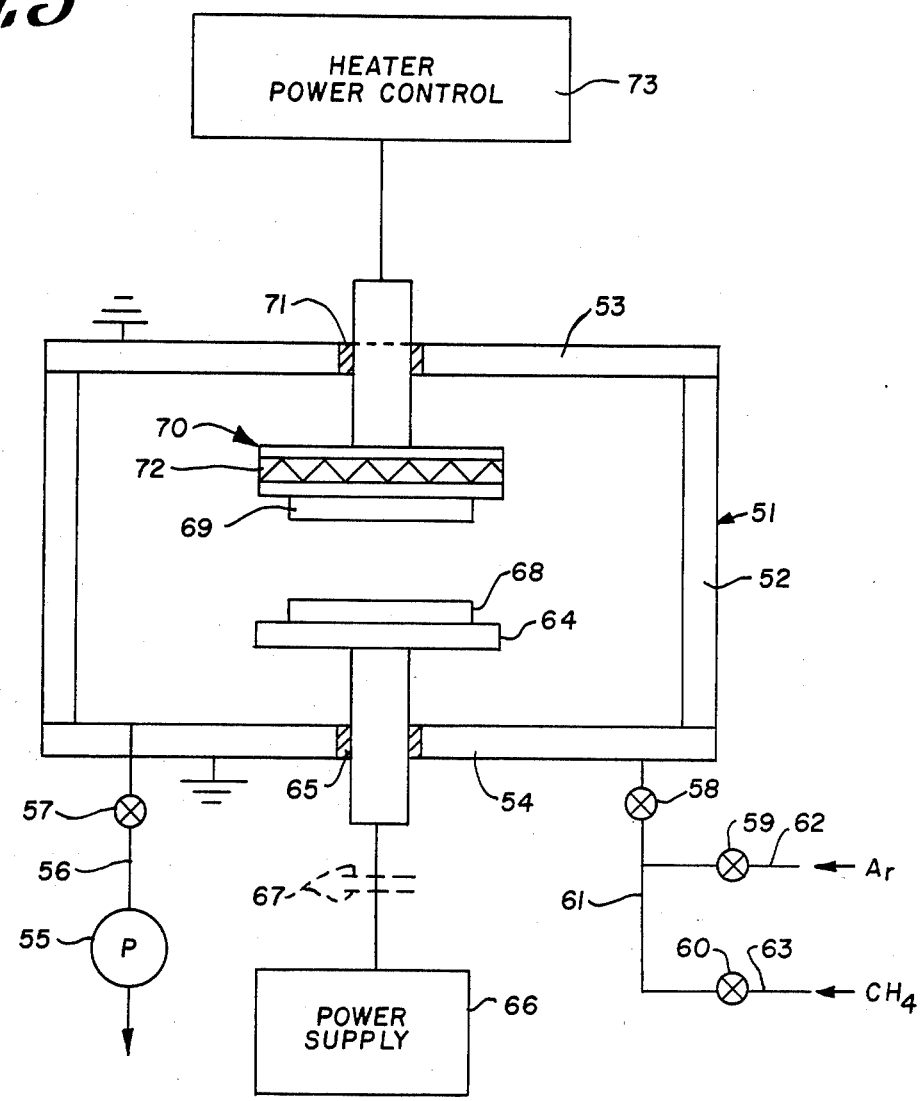
FIG. 3 is a sectional view of a glow discharge apparatus for growing a layer on a substrate.
Figure 4:
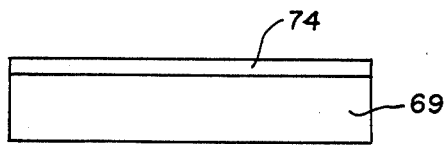
FIG. 4 is a sectional view of a substrate (lens) coated in accordance with the process practiced by the apparatus illustrated in FIG. 3.

The apparatus of FIG. 3 comprises a pressure tight chamber 51 formed by an annular wall 52 closed by earthed top and bottom plates 53, 54, respectively. The plates 53, 54 form anodes. A vacuum pump 55 is connected by a pipe 56 and valve 57 to evacuate the chambers sl and maintain a desired vacuum during growth. Supplies of gases, e.g., argon and hydrocarbon gas such as butane, or gases such as silane, or germane are held into the chambers sl via valves 58, 59, 60 and pipes 61, 62, 63. A cathode structure 64 is mounted in the chambers sl and electrically isolated from the bottom plate 54 by a sleeve 65. Electrical power is supplied to the cathode 64 by a power source 66. For an A.C. supply this is through a capacitor 67, a D.C. supply needs no capacitor.

A piece of material 68 such as silicon, germanium, etc., is located on the upper surface of the cathode surface 64 to form the target. Above the target 68 a substrate 69 is held by a holder 70 electrically isolated from the top plate 53 by a sleeve 71. Inside the holder 70 is an electrical resistance heater 72 supplied with power from a heater control/power supply 73. The substrates 69 forms a support on which layer 74 of the required material is grown. It may be regular, flat or curved, or irregular. To ensure even coating of a substrate 69, it may be rotated with or by the holder 70.

Operation to grow $Si_xC_{1-x}$ is a follows. A target material 68 of silicon is mounted on the cathode 64 to form the cathode in a glow discharge. A thin substrate 69 of aluminum is fixed to the holder 70. The chamber 51 is evacuated to about $10^{-5}$ Torr. to remore contaminants. Argon and butane gas are bled into the chamber through the valves 58, 59, 60, and the pump 55 is operated to maintain a pressure of about 0.7 to $1 \times 10^{-2}$ Torr. on an air calibrated gauge. The substrate 69 is heated to about 550° C. and maintained at this temperature during growth of the layer 74.

R.F. power of typically 1 kvolt, 13 MHz and 200 watts power is supplied to the cathode 64, 68. This ionizes the gas mixture. Positively charged carbon ions are attracted to and stick to the target 68 acting on the cathode. Without the presence of argon ions that would result in growth of a carbon layer on the target 68. The positively charged argon ions sputter both these newly deposited carbon molecules and silicon molecules from the target 68. Sputtered molecules of carbon and silicon land and adhere to the substrate 69 gradually building up a layer 74 of $Si_xC_{1-x}$. The value of x is adjustable by adjusting the argon:butane ratio inputs. When the required thickness of the grown layer has been obtained, the glow discharge is stopped and the substrate allowed to cool.

For a D.C. generated plasma, the supply is typically at 2 kvolts.

An electrical bias may be applied to the substrate during growth of the layer 74.

If a self-supporting layer of SiC is required, the aluminum substrate is etched away leaving a $Si_xC_{1-x}$ layer. Providing that growth conditions were correct, the $Si_xC_{1-x}$ layer is transparent to radiation in the 3–5 μm waveband.

The second embodiment further provides means for forming a layer of SiC as a thin (e.g., 1 μm) coating on a ZnS or ZnSe lens. The hard SiC forms an excellent abrasion resistant protective layer that is transparent at 3–5 μm wavelengths. The layer coating the lens substrate is hydrogen-free and strain-free. The coating has a markedly reduced interstitial carbon content which means the coating is infra-red transparent. For coating surfaces, the substrate may be temporarily connected as a cathode and argon gas only admitted to the chamber. A glow discharge is formed and the substrate cleaned. After a suitable time of cleaning the glow discharge is stopped and the above process is started.

Coatings of, e.g., 1 μm thick $Ge_xC_{1-x}$ on Ge, ZnS, or ZnSe may be made as above using a target material of Ge. Providing that the correct growth conditions are observed, the $Ge_xC_{1-x}$ is optically transparent in the 3–5 um and 10–14 μm wavelength band. The coating is hard and may be used alone or as a protective coating on lens substrates. As before, the value of x in the grown layer is controlled by controlling the proportion of Ar and butane gases. Again, the value of x may vary. For example when coating germanium lenses, the value of x may initially be close to 1 and then gradually change towards zero. This promotes bonding between the layer and the lens material as described hereinbefore.

Similarly, self-supporting layers of GeC may be grown on aluminum substrates, which substrates are subsequently etched away.

When growing layers of more than two materials, one material may be introduced from an ion beam source or molecular beam source.

What is claimed is:

1. An infra-red transparent optical component comprising a germanium, ZnS or ZnSe substrate coated on at least one surface with a layer of $Ge_xC_{1-x}$, where $0 < X < 1$, said layer being substantially infra-red transparent, hydrogen-free and strain-free.

2. An infra-red transparent optical component comprising a ZnS, a germanium, or a ZnSe substrate coated on at least one surface with a layer of $Si_xC_{1-x}$, where $0 < x < 1$, said layer being substantially infra-red transparent, hydrogen-free, and strain-free.

3. The infra-red transparent optical component according to claim 1, wherein the value of x varies across the thickness of the layer.

4. The infra-red transparent optical component according to claim 2, wherein the value of x varies across the thickness of the layer.

5. The infra-red transparent optical component according to claim 1 wherein said substrate is coated with a plurality of said layers, each said layer having a different value of x, the last such layer non-adjacent to said substrate having the lowest value of x.

6. The infra-red transparent optical component according to claim 2, wherein said substrate is coated with a plurality of coating layers, each said layer having a different value of x, the last such layer non-adjacent to said substrate having the lowest x value.

7. The infra-red transparent optical component according to claim 1, wherein a bonding layer is provided between the substrate and the layer.

8. The infra-red transparent optical component according to claim 2, wherein a bonding layer is provided between the substrate and the layer.

9. An infra-red transparent optical component according to claim 1, wherein a said layer is about 1 to 10 μm thick.

10. An infra-red transparent optical component according to claim 1, wherein said layer is at least about 1 μm thick.

11. The infra-red transparent optical component according to claim 9, wherein the value of x varies across the thickness of the layer.

12. The infra-red transparent optical component according to claim 9, wherein said substrate is coated with a plurality of said layers, each said layer having a different value of x, the last such layer non-adjacent to said substrate having the lowest value of x.

13. The infra-red transparent optical component according to claim 12, wherein a bonding layer is provided between the substrate and the first layer.

14. An infra-red transparent optical component according to claim 2, wherein the layer is about 1 μm to 10 μm thick.

15. The infra-red transparent optical component according to claim 13, wherein the value of x varies across the thickness of the layer.

16. The infra-red transparent optical component according to claim 2, wherein the layer is at least about 1 μm thick.

17. The infra-red transparent optical component according to claim 14, wherein said substrate is coated with a plurality of layers, each said layer having a different value of x, the last such layer non-adjacent to said substrate having the lowest x value.

* * * * *